United States Patent [19]

Schwab et al.

[11] 4,186,399
[45] Jan. 29, 1980

[54] GONIOMETER CIRCUIT FOR VOR SYSTEM

[75] Inventors: Carl E. Schwab, Huntington Station; Joseph A. Hutter, Rocky Point, both of N.Y.

[73] Assignee: General Signal Corporation, Woodbury, N.Y.

[21] Appl. No.: 955,321

[22] Filed: Oct. 27, 1978

[51] Int. Cl.² ............................................. G01S 1/08
[52] U.S. Cl. ................................................. 343/102
[58] Field of Search ................ 328/24; 343/102, 106 R

[56] References Cited
U.S. PATENT DOCUMENTS

| | | | |
|---|---|---|---|
| 3,553,590 | 1/1971 | Höfgen | 343/102 X |
| 3,979,751 | 9/1976 | van den Berg | 343/106 |
| 4,125,836 | 11/1978 | Stavis | 343/102 |

Primary Examiner—T. H. Tubbesing
Attorney, Agent, or Firm—Oblon, Fisher, Spivak, McClelland & Maier

[57] ABSTRACT

The present invention relates to an improved goniometer circuit having extremely low modulation harmonic distortion characteristics, which is particularly suitable for use in a VOR navigation system. In the disclosed circuit, modulation harmonic distortion is greatly reduced by the use of a phase lock loop operating at small signal levels prior to the power amplification stage of the system. The phase lock loop employs a voltage controlled oscillator to completely eliminate harmonic distortion so that the final output of the system is virtually modulation free.

9 Claims, 3 Drawing Figures

GONIOMETER CIRCUIT FOR VOR SYSTEM

BACKGROUND OF THE INVENTION

1. Field of the Invention

The present invention relates primarily to goniometer circuits and more particularly to goniometer circuits having extremely low modulation harmonic distortion.

2. Description of the Prior Art

The use of electronic goniometer circuits in VOR navigation systems has long been well known. The goniometer circuit is used with a plurality of antennas so that the direction of maximum signal output may be rotated in azimuth without physically moving the antenna array. Although existing electronic goniometers have been generally successful in attaining their intended function, it has been very difficult to eliminate modulation harmonic distortion from the output of goniometer circuits, due to the nature of the modulation required within the goniometer circuit. As is well known to those skilled in the art, modulation harmonic distortion is highly undesirable in navigation systems and can result in serious navigation errors. Accordingly a need exists for an improved goniometer circuit wherein modulation harmonic distortion is substantially eliminated.

The problem of eliminating modulation harmonic distortion is a complex one that has not been satisfactorily dealt with in the past. As an example of a previously known electronic goniometer circuit, attention is directed to U.S. Pat. No. 3,553,590, issued Jan. 5, 1971. According to this reference, and referring particularly to the embodiment of the invention shown in FIG. 4 thereof, upper and lower sideband signals are produced by an appropriate sequence of signal modulations. In the course of such modulations, however, sum and difference frequencies are produced, as is well known to those skilled in the art. These sum and difference frequencies include the desired sidebands as well as multiples of these sideband frequencies. These multiples are undesirable harmonics of the primary sideband signals which produce modulation harmonic distortion. In the above-referenced patent, the sideband signals, along with the harmonic distortion that they inherently contain, are passed through power amplifiers to an output hybrid circuit where the final modulation takes place. After power amplification, the sideband signals are detected and fed to a phase bridge which feeds back a DC error voltage to the initial modulation phase of the disclosed system to maintain a degree of phase locking. However the system disclosed in this patent fails to eliminate the undesirable modulation harmonics from the initially modulated signal and these undesirable modulation harmonics are amplified in power along with the desirable components of the signal. The phase correcting circuit is insufficient to fully eliminate the undesirable harmonics from the output signal. Accordingly, the prior art system as represented by this patent does not eliminate modulation harmonic distortion from the goniometer output signal. It is therefore believed apparent that further improvements in goniometer circuitry are desirable.

SUMMARY OF THE INVENTION

Accordingly, one object of this invention is to provide a novel goniometer circuit.

Another object of the present invention is the provision of an improved goniometer circuit wherein modulation harmonic distortion is essentially eliminated.

Yet another object of the present invention is the provision of a novel goniometer circuit using a phase lock loop to essentially eliminate modulation harmonic distortion.

A still further object of the present invention is the provision of a novel goniometer circuit wherein a phase lock loop employing a voltage controlled oscillator is used to substantially eliminate modulation harmonic distortion from a goniometer circuit.

Briefly, these and other objects of the present invention are attained by the provision of a novel goniometer circuit wherein a phase lock loop including a voltage controlled oscillator is used to eliminate undesirable sideband harmonics at low power levels. The harmonically pure signal produced by the phase locked oscillator is then fed through a multistage power amplifier to the final modulation stage so that the ultimate output signal of the goniometer is virtually free of harmonic distortion. Other unique control and balancing features are provided to the goniometer circuit of the present invention.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1A:
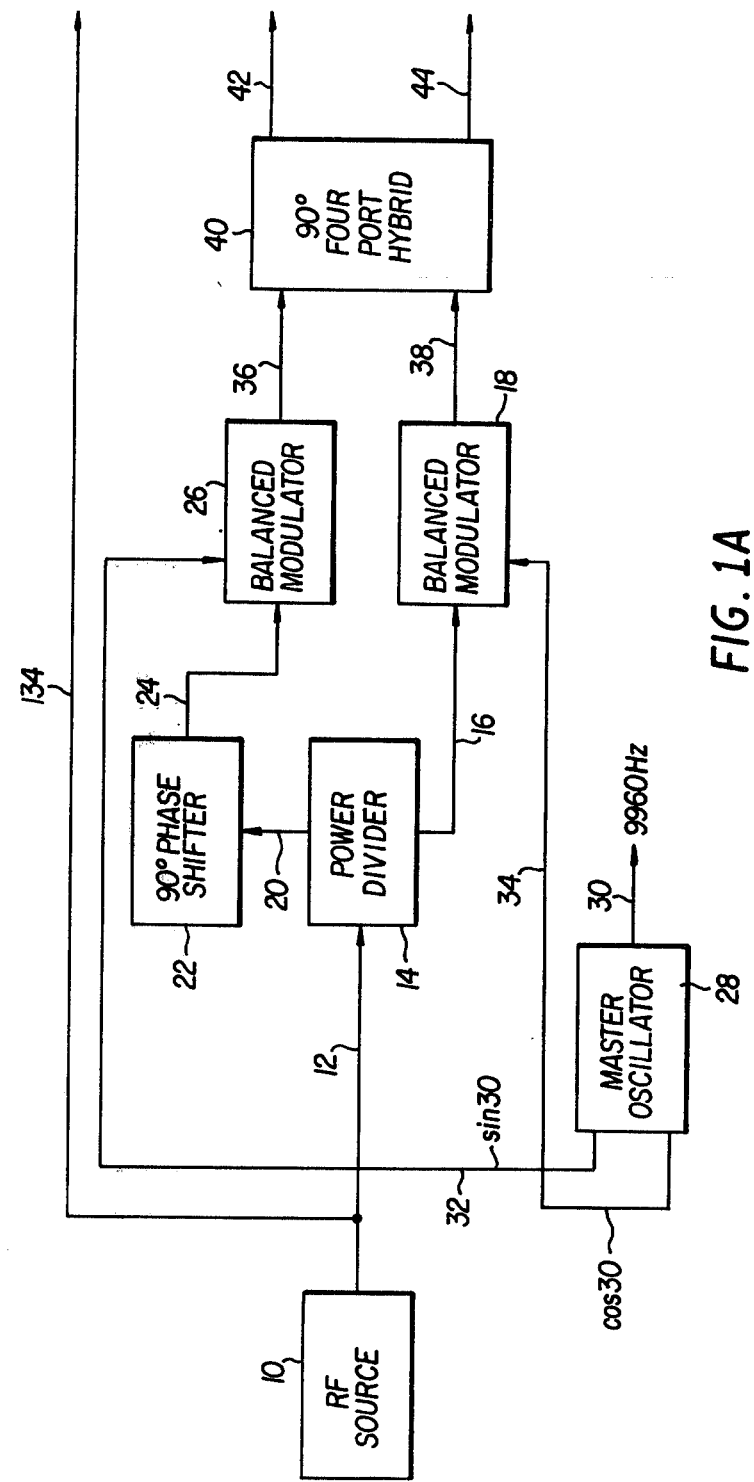
FIGS. 1A and 1B together form a block diagram of the goniometer system of the present invention.

Referring now to the drawings, wherein like reference numerals designate identical or corresponding parts throughout the several views, and more particularly to FIG. 1 thereof, a block diagram illustrating the basic components of the present invention is shown. More particularly, an RF source 10 is shown for providing an appropriate high frequency low power signal. The RF source may, for example, provide a 100 mW signal at a frequency of 108 to 118 mHz in the VOR frequency range. The output of the RF source 10 is applied via a line 12 to a conventional power divider 14 wherein the input power is divided into two substantially equal portions, one of which is applied via a line 16 to a balanced modulator 18. The other half of the power is fed via a line 20 to a 90° phase shifter 22 and then over a line 24 to a second balanced modulator 26. It is noted that the 90° phase shifter 22 may be incorporated into the power divider in commercially available units. It is further noted that the balanced modulators 18 and 26 are conventional circuits such as SRA-1 doubly balanced mixers produced by Minicircuit Laboratories of Brooklyn, N.Y.

A master oscillator 28 of conventional design provides two 30 Hz output signals shifted in phase by 90° relative to one another as well as the conventional 9,960 Hz VOR reference signal. The latter output is provided on a line 30 to be coupled to appropriate circuitry well known to those skilled in the art. The phase shifted 30

Hz signals are conventionally referred to as sin 30 and cos 30, the former being coupled to balanced modulator 26 via line 32 and the latter being coupled to balanced modulator 18 via line 34. It is apparent that the high frequency signals from RF source 10 are also delivered to the balanced modulators 18 and 26 via the lines 16 and 24, respectively, the latter line supplying a signal in phase quadrature with respect to the former. Similarly, the sine and cosine signals delivered to the balanced modulators via the lines 32 and 34 may be thought of as being in phase quadrature with respect to one another. The balanced modulators provide output signals in the form of modulated oscillations of frequencies corresponding to upper and lower sidebands of the output of RF source 10 with the carrier suppressed. These modulated signals are applied via lines 36 and 38 to a conventional hybrid network 40. The hybrid network which may also be characterized as a 90° four-port network, a hybrid ring or a three dB directional coupler, is a conventional apparatus which may be formed of transmission line lengths, for example, as is well known to those skilled in the art. The hybrid network permits energy to be transferred from any one port into only two of the remaining three ports, and this is usually done so that the energy is equally divided between these two ports. The result is that the modulated signals applied to the input of the hybrid network are converted to unmodulated signals at the output thereof having a frequency of the upper and lower sidebands, respectively of the original RF carrier from source 10. The hybrid network produces sum and difference frequencies to provide the unmodulated carrier signals at its output.

It should be noted, however, that in producing sum and difference frequencies the hybrid network 40 also produces modulation harmonic distortion in the form of undesired harmonics of the sought after sideband signals in view of the fact that the input signal to the hybrid is not pure in itself. Accordingly, the output signals emanating from the hybrid network over lines 42 and 44 inherently contain modulation harmonic distortion. If these signals were fed directly to power amplifiers and subsequently were delivered to the output of the illustrated network, the output of the overall system would also possess modulation harmonic distortion. To eliminate the harmonic distortion from the signal of the present invention, a unique network has been provided wherein signals of the desired frequency are regenerated while the distortion signals are eliminated.

Figure 1B:
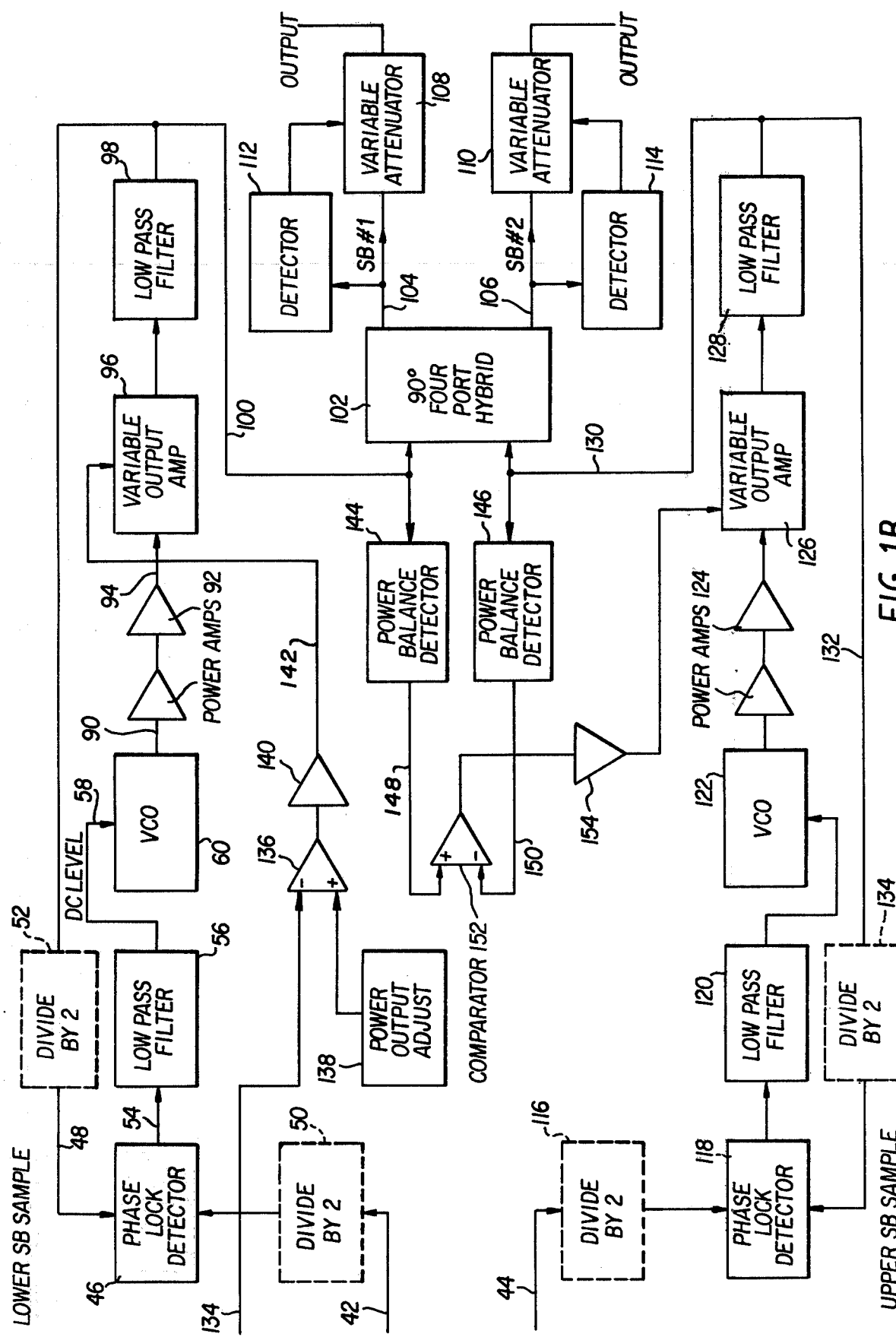

For conciseness, the following description will first be limited to the lower sideband signal block diagram found at the top of FIG. 1B. The output of hybrid network 40 is coupled via line 42 to phase lock detector 46. This device also receives a feedback input via line 48. The phase lock detector is preferably a commercially available integrated circuit designated MC-12040 manufactured by the Motorola Corporation. This circuit provides no output if the two illustrated inputs are phase locked, and provides an output in the form of a pulse voltage when the signals on the input lines 42 and 48 are not phase locked. Since the frequency range of the specific integrated circuit previously mentioned is limited, it may be desirable to include optional frequency dividers 50 and 52 in the lines 42 and 48, as shown. These circuits preferably divide the input signal frequency by two, and may for example be conventional MC-12012 integrated circuits manufactured by Motorola. It should be emphasized, however, that the divide-by-two circuits are optional due to the present frequency range limitation of the specific phase lock detector referenced above, and could be eliminated as long as a phase lock detector having a sufficient frequency range were used in accordance with the present invention.

The output of the phase lock detector 46 is in the form of voltage pulses since the two applied signals on lines 42 and 48 will normally fluctuate into and out of phase lock. This pulse voltage generated by the phase lock detector 46 is applied via a line 54 to a low pass filter 56 which integrates the pulse voltage into a DC level. The DC level appearing at the output of the low pass filter is coupled through a line 58 to a voltage controlled oscillator 60. The details of the voltage controlled oscillator circuitry are illustrated more clearly in FIG. 2.

Figure 2:
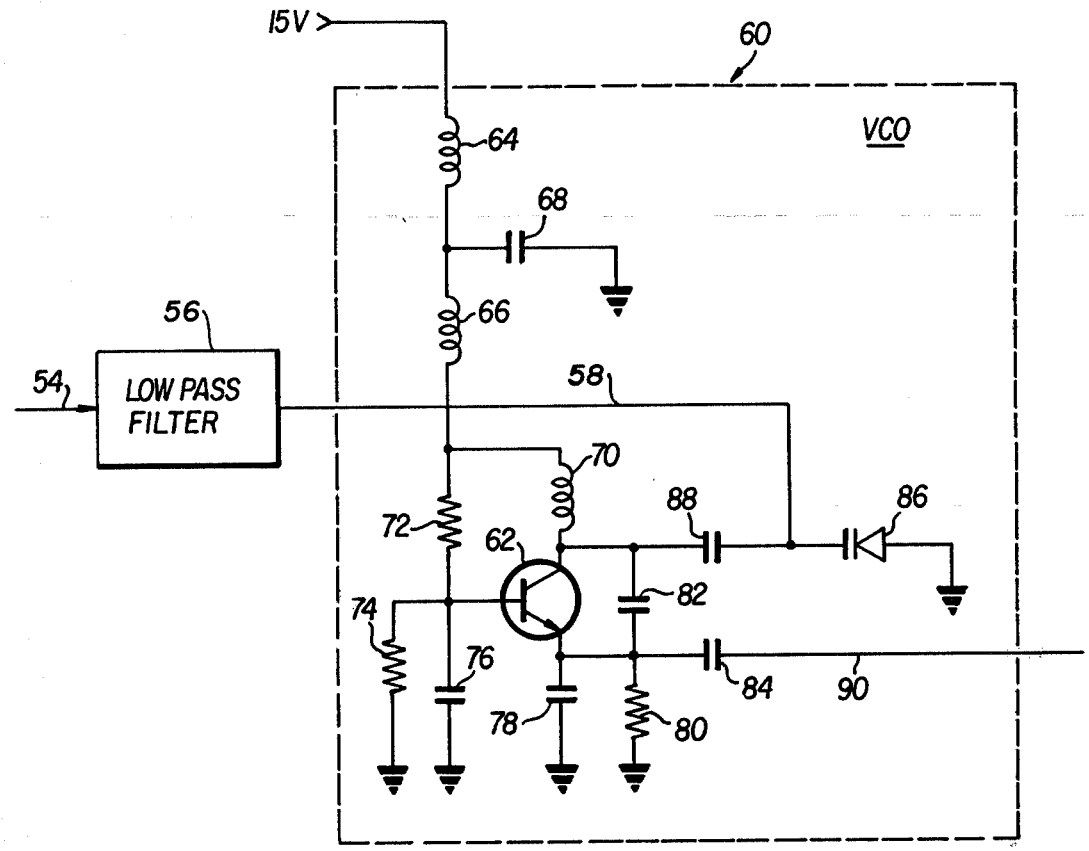
FIG. 2 is a circuit diagram illustrating in more detail the voltage controlled oscillator of the present invention.

Referring to FIG. 2, the voltage controlled oscillator includes a suitable high frequency transistor 62. A suitable voltage source is coupled through a resonant circuit including inductors 64 and 66, having a capacitor 68 connected between them, and through a further inductor 70 to the collector of transistor 62. Biasing circuitry including resistors 72 and 74 is coupled to the emitter of transistor 62, as is a bypass capacitor 76. A second bypass capacitor 78 is coupled to the emitter of transistor 62 as is a biasing resistor 80 and appropriate output coupling capacitors 82 and 84. A VARICAP or variable capacity diode 86 is also coupled through a capacitor 88 to the collector of transistor 62. The DC error voltage signal from low pass filter 56 is applied over line 58 to the junction of VARICAP 86 and capacitor 88 for the purpose of adjusting the capacitance of the VARICAP in accordance with the error voltage, which in turn is proportional to the lack of phase lock between the signals applied to phase lock detector 46, as previously explained.

In operation, the voltage controlled oscillator is designed and biased to oscillate near the desired output frequency. Its precise oscillating frequency is determined by the capacitance of the VARICAP 86 which is in turn controlled by the error voltage applied on line 58. The error voltage is proportional to the phase difference existing between the ultimate output signal of the system, sampled via line 48, and the unmodulated sideband signal derived from hybrid 40 and applied over line 42 to phase lock detector 46. An important aspect of the present invention resides in the fact that the output of the hybrid circuit 40, which contains modulation harmonic distortion as previously described, is not directly fed to the output of the system. Rather, this signal is simply used to provide a control signal to the VCO 60 which is an entirely independent oscillator. The use of the VCO 60 as an independent oscillator causes substantially all of the spurious harmonics to be dropped or lost from the ultimate output signal. This concept will be explained in more detail subsequently.

Returning again to FIG. 1B, the output of VCO 60 is applied via line 90 to a multi-stage power amplifier 92 of conventional design. The power amplifier may be, for example, a well known Class C type amplifier having good limiter properties. The output of the multistage amplifier 92 is coupled through a line 94 to a variable output amplifier 96 which forms the final stage of amplification. The output of the variable amplifier 96 is coupled to a low pass filter 98 for attenuating any remaining high frequency harmonic distortion.

The output of low pass filter 98 is coupled by a line 100 to a 90° four-port hybrid network 102 which is conventional in design and similar to the hybrid network 40 previously described. The hybrid network provides the final combination of the sideband signals to put them in the desired form for the goniometer output. This form, well known to those skilled in the art, consists of double sideband suppressed carrier signals in audio quadrature modulated 100% at 30 Hz. The output of the hybrid circuit 102 is fed via lines 104 and 106 to a pair of identical variable attenuators 108 and 110 to the ultimate utilization circuitry, such as an antenna device. Detectors 112 and 114 are coupled to the lines 104 and 106 respectively and also the variable attenuators 108 and 110 for the purpose of maintaining the output signals at identical power levels.

Although only the lower sideband signal processing circuitry has been described to this point, the upper sideband circuitry is virtually identical. Specifically, this circuitry includes an optional frequency divider 116 which is preferably identical to the frequency divider 50 described above. Similarly, a phase lock detector 118 is coupled to a low pass filter 120 which is in turn coupled to a voltage controlled oscillator 122 in the upper sideband circuitry. The output of this oscillator is applied to a multistage power amplifier 124 which in turn is coupled to a variable output amplifier 126 forming the final amplifier stage. A low pass filter 128 couples the output of the variable output amplifier 126 to the hybrid circuit 102 via a line 130. A feedback line 132 which may include an optional divide by two circuit 134 is coupled to phase lock detector 118. Each of the components described with respect to the upper sideband circuitry is preferably identical to the previously described lower band circuitry.

Control circuitry is also provided for adjusting the output of the system and for maintaining power equality between the two output sideband signals. Specifically, a sample line 134 is coupled to the RF source 10 for supplying a sample of the RF carrier to a comparator 136. A power output adjusting device 138, which may be a variable potentiometer for example, is coupled to the other input of the comparator. The output of the comparator 136 is coupled through an amplifier stage 140 and a line 142 to the variable output amplifier 96 to control the amplification thereof. The variable output amplifier is conventional in nature and may simply be a power amplifying transistor with the variable voltage on line 142 applied to its collector to thereby adjust its operating bias and accordingly its output level. The use of the comparator 136 is necessary since the output of the goniometer must track the output of the RF source. In other words, decreases in power at the RF source 10 due to thermal drift, aging, etc., must be tracked in the goniometer output.

Although the power output adjust 138 appears to be coupled only to the lower sideband channel, its adjustment actually controls the output of both channels of the goniometer due to the presence of further detector circuitry which will now be described.

A conventional power level or power balance detector 144 is coupled to the line 100 to sense the output power to the lower sideband channel. A substantially identical detector 146 is coupled to the line 130 to monitor the power of the upper sideband channel. The outputs of both of these detectors are coupled via lines 148 and 150, respectively, to a comparator 152 which generates an error signal if the power from the two channels is not equal. This error signal is fed through an amplifier 154 to variable output amplifier 126, which is preferably identical to the variable output amplifier 96 previously described. This arrangement forces the upper sideband channel, which includes the variable output amplifier 126, to maintain exactly the same power output level as the lower sideband channel. Accordingly if the power output adjust 138 is used to change the output power of the lower sideband channel, the comparator 152 will generate a corresponding error signal to change the output of the lower sideband channel and maintain equality between the outputs of the two channels.

OPERATION

Having now described the general arrangement of the system of the present invention, it is believed that a brief summary of the manner in which the present invention operates would be useful to fully explain the advantages of the present invention. In the balanced modulators 18 and 26, 30° signals in phase quadrature are multiplied by two equal segments of the signal from the RF source 10, one of which is phase shifted by 90°. As a result, the upper and lower sideband signals are produced, taking into account the following mathematical relationships, first noting the conventional identities:

$$\text{Cos } A \text{ cos } B = \tfrac{1}{2}[\cos (A+B) + \cos (A-B)] \quad (1)$$

$$\text{Sin } A \text{ sin } B = \tfrac{1}{2}[-\cos (A+B) + \cos (A-B)] \quad (2)$$

In the present system we let $\sin A = \sin W_o t$ where $W_o$ is the VOR frequency 108–118 MHz. Similarly, $\sin B = \sin W_i t$, the goniometer modulation frequency. Adding equations 1 and 2 yields the result $\cos (A-B) = (W_o - W_i)t$, the lower sideband signal. Similarly, subtracting equations 1 and 2 yields $\cos (A+B) = -(W_o + W_i)t$, the upper sideband signal.

These two signals are passed through the hybrid circuit 40 to produce continuous wave (i.e. unmodulated) signals at the frequencies of the two sidebands. Once the sideband signals are attained, it is necessary to amplify them to a high power level for ultimate use in the goniometer output. It is logical, then, to feed the sideband signals directly from the hybrid circuit 40 into high power amplifiers, as has been done in the prior art. The problem with such an arrangement is that undesirable higher harmonics of the desired modulation frequencies are always generated simply by the nature of conventional electronic circuits. These undesirable modulation harmonics must be eliminated to maintain the frequency purity of the output signal, which is essential in navigation systems. In the prior art efforts have been made to remove this distortion from the signal after it has been passed through the power amplifiers, but this solution is highly inefficient because it requires removal of distortion at high power levels.

This problem has been eliminated in the present invention by the use of a phase lock loop which includes a voltage controlled oscillator used to phase and frequency lock the sideband signals. As pointed out previously, the voltage controlled oscillators used in the arrangement illustrated in FIG. 1B are effectively independent oscillators producing signals at the desired frequency of the two sidebands. Phase and frequency information from the original sideband signals is used to maintain the voltage controlled oscillators at the proper frequency. However by using the phase lock detectors 46 and 118 in conjunction with the appropriate feedback loops, the phase and frequency of the desired sideband signals is distilled or isolated from the spurious harmonics generated by the system. Accordingly the output of the voltage controlled oscillators 60 and 122 are virtually pure and undistorted signals at the appropriate frequencies. It is these high quality signals which are fed to the multistage amplifiers to be amplified to high power levels for ultimate utilization. The technique of using the phase lock loop and the voltage controlled oscillator in this manner is therefore highly efficient in maintaining an extremely high quality output signal purity and does not require attempts to filter or otherwise extensively operate on the high power output signal. Thus the present invention obtains significant advantages over the prior art in this respect.

Once the sideband signals of high frequency purity are obtained and amplified, as described above, they are combined in the four-port hybrid circuit 102 to produce signals of the following form:

$\cos \frac{1}{2}(w_u t - w_l t)$ and
$-\sin \frac{1}{2}(w_u t - w_l t)$, where $w_u$ is the upper sideband frequency and $w_l$ is the lower sideband frequency. Accordingly, the desired outputs are attained by the illustrated system.

It is noted that while the feedback lines 48 and 132 are shown coupled to the outputs of low pass filters 98 and 128 respectively, the appropriate feedback signal could also be taken from the outputs of voltage controlled oscillators 60 and 122, respectively, or from a suitable point in the circuit between the voltage controlled oscillators and the low pass filters 98 and 128.

Obviously, numerous additional modifications and variations of the present invention are possible in light of the above teachings. It is therefore to be understood that within the scope of the appended claims, the invention may be practiced otherwise than as specifically described herein.

What is claimed as new and desired to be secured by Letters Patent in the United States is:

1. A goniometer circuit having extremely low modulation harmonic distortion comprising:
   signal source means for producing carrier and modulating signals,
   signal combining means coupled to said signal source means for producing unmodulated sideband signals,
   phase lock detector means coupled to said signal combining means for monitoring the frequency and phase of said sideband signals and for producing an output in response thereto,
   voltage controlled oscillator means coupled to said phase lock detector for generating an undistorted output in response to said output of said phase lock detector means; and
   power amplifier means coupled to said voltage controlled oscillator means for amplifying the output signal power of said voltage controlled oscillator means.

2. A goniometer circuit as in claim 1, further comprising:
   signal modulating means coupled to said power amplifier means for producing fully modulated double sideband suppressed carrier signals in audio quadrature.

3. A goniometer as in claim 2, further comprising:
   a pair of output signal lines coupled to said signal modulating means,
   variable attenuator means coupled to each of said output signal lines for adjusting output power levels on said output signal lines; and
   detector means coupled to said output signal lines and to said variable attenuator means for adjusting the attenuation of said variable attenuator means.

4. A goniometer circuit as in claim 1, further comprising:
   feedback circuit means between the output of said voltage controlled oscillator means and said phase lock detector means.

5. A goniometer circuit as in claim 1, further comprising:
   low pass filter means coupled between said phase lock detector means and said voltage controlled oscillator means for integrating the output of said phase lock detector means.

6. A goniometer circuit as in claim 1, wherein:
   said power amplifier means includes variable output power amplifier means.

7. A goniometer circuit as in claim 6, further comprising:
   comparator means coupled to said variable output power amplifier means for controlling the output power thereof.

8. A goniometer circuit as in claim 7, further comprising:
   signal sample line means coupled between said signal source means and said comparator means for causing said comparator to generate an output which varies in accordance with variations in output within said signal source means.

9. A goniometer circuit as in claim 8, further comprising:
   power balance detector means coupled between the output of said power amplifier means and said comparator means for causing said comparator means to generate an error signal to adjust the output of said variable power amplifier means.

* * * * *